United States Patent
Dammura

(10) Patent No.: US 12,540,041 B2
(45) Date of Patent: Feb. 3, 2026

(54) END EFFECTOR AND SUBSTRATE PROCESSING APPARATUS INCLUDING END EFFECTOR

(71) Applicant: ASM IP Holding, B.V., Almere (NL)

(72) Inventor: Yuki Dammura, Yamato (JP)

(73) Assignee: ASM IP Holding B.V., Almere (NL)

( * ) Notice: Subject to any disclaimer, the term of this patent is extended or adjusted under 35 U.S.C. 154(b) by 329 days.

(21) Appl. No.: 17/932,726

(22) Filed: Sep. 16, 2022

(65) Prior Publication Data
US 2023/0091979 A1 Mar. 23, 2023

Related U.S. Application Data

(60) Provisional application No. 63/245,766, filed on Sep. 17, 2021.

(51) Int. Cl.
*B65G 47/90* (2006.01)

(52) U.S. Cl.
CPC ........... *B65G 47/90* (2013.01); *Y10S 414/141* (2013.01); *Y10S 901/30* (2013.01)

(58) Field of Classification Search
None
See application file for complete search history.

(56) References Cited

U.S. PATENT DOCUMENTS

| | | | |
|---|---|---|---|
| 5,855,681 A | 1/1999 | Maydan | |
| 6,217,663 B1 * | 4/2001 | Inokuchi | H01L 21/68721 118/500 |
| 7,963,736 B2 | 6/2011 | Takizawa | |
| 8,041,450 B2 | 10/2011 | Takizawa | |
| 8,141,926 B2 * | 3/2012 | Fujii | H01L 21/67742 414/941 |
| 9,370,863 B2 | 6/2016 | Tsuji | |
| 10,267,360 B2 * | 4/2019 | Pariza | B32B 15/18 |
| 2002/0192056 A1 * | 12/2002 | Reimer | H01L 21/68707 414/217 |
| 2012/0325148 A1 | 12/2012 | Yamagishi | |
| 2016/0343603 A1 * | 11/2016 | Feng | B25J 15/0014 |
| 2019/0267215 A1 * | 8/2019 | Rats | H01J 37/32192 |

FOREIGN PATENT DOCUMENTS

EP 1968110 A2 9/2008

* cited by examiner

*Primary Examiner* — Michael S Lowe
(74) *Attorney, Agent, or Firm* — Banner & Witcoff, Ltd.

(57) ABSTRACT

An end effector is disclosed. Exemplary end effector includes a paddle, wherein a proximal end of the paddle is provided with a rear protrusion for positioning a substrate; a ring extending from the paddle, wherein the ring is provided with a circular protrusion for supporting the substrate; and a blade extending from the ring, wherein a distal end of the blade is provided with a front protrusion for positioning a substrate.

20 Claims, 3 Drawing Sheets

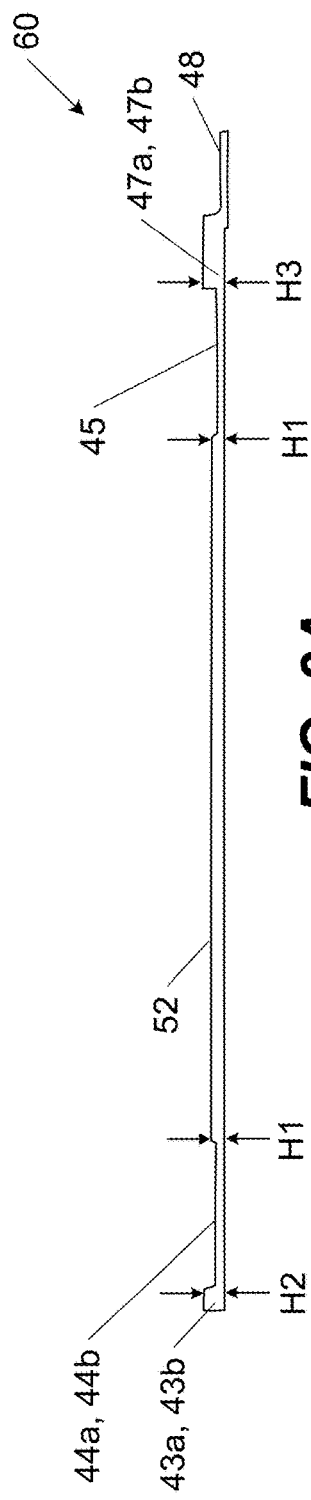
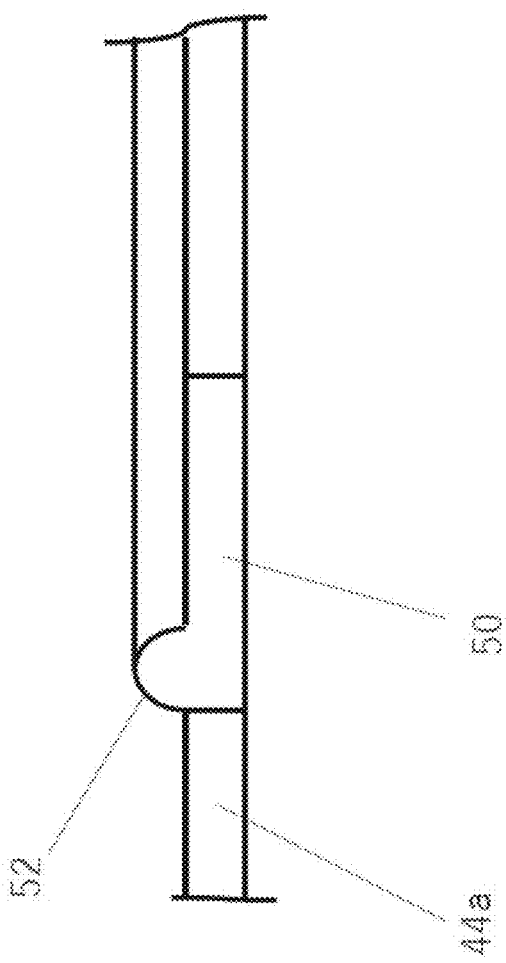
FIG. 3A
FIG. 4

END EFFECTOR AND SUBSTRATE PROCESSING APPARATUS INCLUDING END EFFECTOR

FIELD OF INVENTION

The present disclosure relates generally to an end effector. More particularly, exemplary embodiments of the present disclosure relate to an end effector for transporting a substrate and a substrate processing apparatus including an end effector.

BACKGROUND OF THE DISCLOSURE

A process of using a substrate processing apparatus includes a step of transporting a substrate from a Front Opening Unified Pod (FOUP) to a processing chamber via a substrate handling chamber and a load lock chamber using a robotic arm, or a step of transporting a substrate from a reaction chamber to another reaction chamber using a robotic arm. The robotic arm may be provided with an end effector for loading a substrate thereon and carrying the substrate from one chamber to another.

Typically, the end effector does not have a mechanical clamping mechanism for clamping a substrate, and by a substrate positioning or alignment mechanism (e.g., those disclosed in U.S. Patent Application Publication No. 2012/0325148, U.S. Pat. Nos. 7,963,736, and 8,041,450, each disclosure of which is herein incorporated by reference in its entirety), a substrate is placed on the end effector for transfer. The substrate stays on the end effector while being carried by friction against a surface of the end effector, which is caused by gravity.

As the throughput is increased, the transferring speed by the robotic arm is also increased. When the transferring speed is increased, since the substrate stays on the end effector by friction, the substrate sometimes moves relative to the end effector and slips out of place, thereby causing a transfer error and decreasing transfer stability. An anti-slip end effector having several pins are used to suppress the movement. An exemplary end effector is disclosed in U.S. Pat. No. 9,370,863, which is hereby incorporated by reference.

Any discussion, including discussion of problems and solutions, set forth in this section, has been included in this disclosure solely for the purpose of providing a context for the present disclosure, and should not be taken as an admission that any or all of the discussion was known at the time the invention was made or otherwise constitutes prior art.

SUMMARY OF THE DISCLOSURE

This summary is provided to introduce a selection of concepts in a simplified form. These concepts are described in further detail in the detailed description of example embodiments of the disclosure below. This summary is not intended to identify key features or essential features of the claimed subject matter, nor is it intended to be used to limit the scope of the claimed subject matter.

In accordance with exemplary embodiments of the disclosure, an end effector is provided. The end effector may comprise a paddle, wherein a proximal end of the paddle is provided with a rear protrusion for positioning a substrate; a ring extending from the paddle, wherein the ring is provided with a circular protrusion for supporting the substrate; and a blade extending from the ring, wherein a distal end of the blade is provided with a front protrusion for positioning a substrate.

In various embodiments, a height of the circular protrusion may be lower than a height of the rear protrusion and front protrusion.

In various embodiments, an edge of the circular protrusion may be rounded.

In various embodiments, the rounded edge may be semi-circular shape.

In various embodiments, the rounded edge may have a top face having a static friction coefficient of 0.4 or more as measured against the backside of the substrate.

In various embodiments, the semi-circular shape may have a radius of more than 1.0 mm.

In various embodiments, the end effector may comprise Al2O3.

In various embodiments, the end effector may be attached to a robotic arm.

In various embodiments, the robotic arm may be configured to move vertically, front and rear, and laterally.

In various embodiments, a substrate processing apparatus may comprise a reaction chamber for processing a substrate; a substrate handling chamber attached to the reaction chamber; a backend robot disposed in the substrate handling chamber; and a load lock chamber for loading or unloading the substrate, the load lock chamber being attached to the substrate handling chamber; wherein the backend robot includes the robotic arm and the end effector.

In various embodiments, a plurality of sensors may be disposed between the reaction chamber and the substrate handling chamber.

In various embodiments, a diameter of the ring may be less than a distance between the plurality of sensors.

BRIEF DESCRIPTION OF THE DRAWING FIGURES

A more complete understanding of exemplary embodiments of the present disclosure can be derived by referring to the detailed description and claims when considered in connection with the following illustrative figures.

FIG. 3 is a schematic plan view and FIG. 3A is a schematic side view of an end effector according to an embodiment of the present invention.

FIG. 4 is a schematic cross-sectional view of an end effector according to an embodiment of the present invention.

It will be appreciated that elements in the figures are illustrated for simplicity and clarity and have not necessarily been drawn to scale. For example, the dimensions of some of the elements in the figures may be exaggerated relative to other elements to help understanding of illustrated embodiments of the present disclosure.

DETAILED DESCRIPTION OF EXEMPLARY EMBODIMENTS

Although certain embodiments and examples are disclosed below, it will be understood by those in the art that the disclosure extends beyond the specifically disclosed embodiments and/or uses of the disclosure and obvious modifications and equivalents thereof. Thus, it is intended that the scope of the disclosure should not be limited by the particular embodiments described herein.

The illustrations presented herein are not meant to be actual views of any particular material, apparatus, structure, or device, but are merely representations that are used to describe embodiments of the disclosure.

In this disclosure, "gas" may include material that is a gas at normal temperature and pressure, a vaporized solid and/or a vaporized liquid, and may be constituted by a single gas or a mixture of gases, depending on the context. A gas other than the process gas, i.e., a gas introduced without passing through a gas supply unit, such as a shower plate, or the like, may be used for, e.g., sealing the reaction space, and may include a seal gas, such as a rare or other inert gas.

As used herein, the term "substrate" may refer to any underlying material or materials that may be used, or upon which, a device, a circuit, or a film may be formed, which is typically semiconductor wafer.

As used herein, the term "film" and "thin film" may refer to any continuous or non-continuous structures and material deposited by the methods disclosed herein. For example, "film" and "thin film" could include 2D materials, nanorods, nanotubes, or nanoparticles or even partial or full molecular layers or partial or full atomic layers or clusters of atoms and/or molecules. "Film" and "thin film" may comprise material or a layer with pinholes, but still be at least partially continuous.

Figure 1:
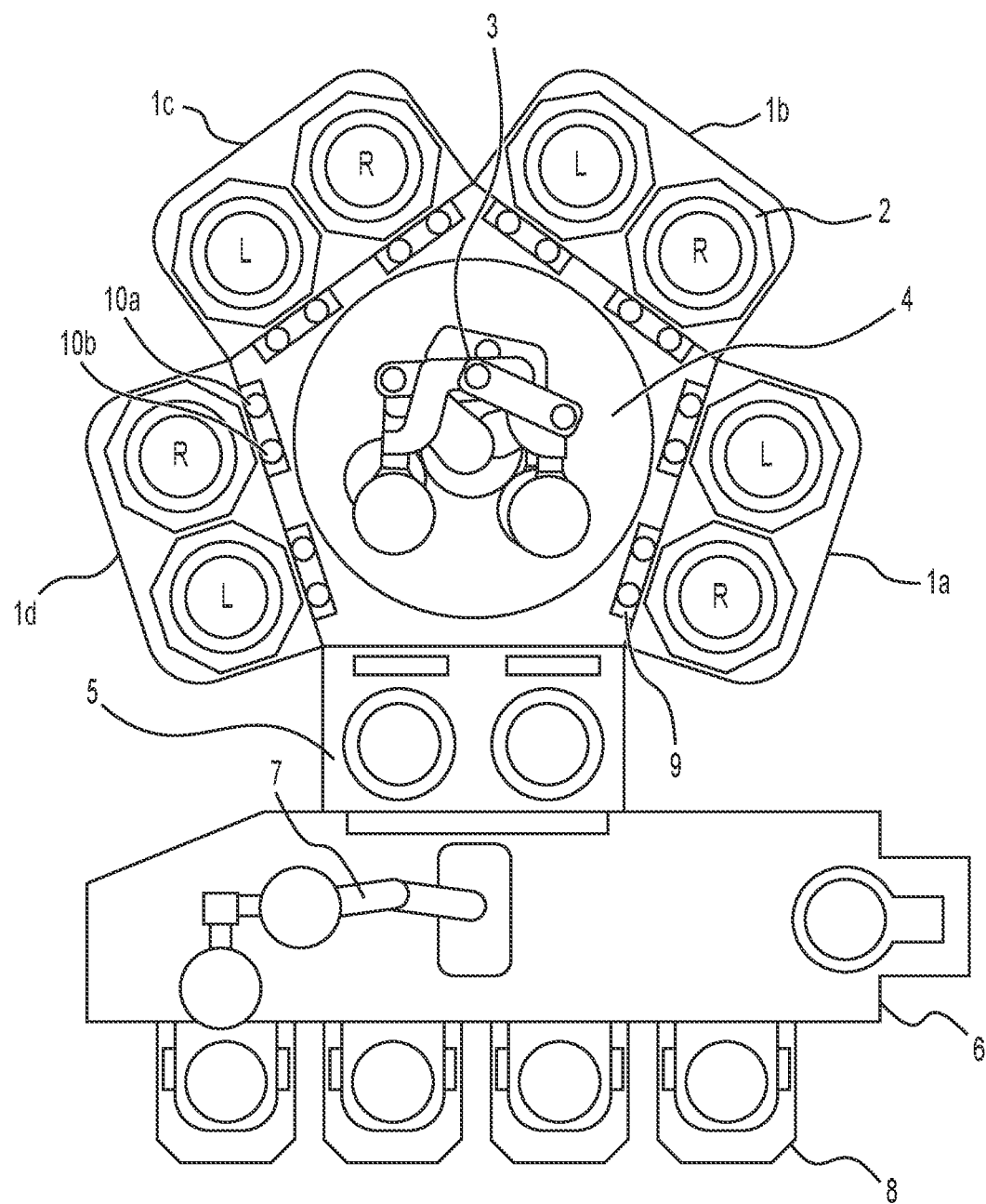
FIG. 1 is a schematic plan view of a semiconductor processing apparatus with dual chamber modules usable in an embodiment of the present invention.

FIG. 1 is a schematic plan view of a substrate processing apparatus with dual chamber modules in some embodiments of the present invention. The substrate processing apparatus may comprise four dual chamber modules 1a, 1b, 1c, 1d (each provided with two reactors 2), a load lock chamber 5, and a substrate handling chamber 4 provided with back end robots 3, desirably in conjunction with controllers programmed to conduct the sequences described below, which can be used in some embodiments of the present invention.

In this embodiment, the substrate processing apparatus may comprise: (i) four dual chamber modules 1a-1d, each having two reaction chambers 2 arranged side by side with their fronts aligned in a line; (ii) a substrate handling chamber 4 including two back end robots 3 (substrate handling robots), each having at least two end-effectors accessible to the two reactors of each unit simultaneously, said substrate handling chamber 4 having a polygonal shape having four sides corresponding to and being attached to the four chamber modules 1a-1d, respectively, and one additional side for a load lock chamber 5, all the sides being disposed on the same plane; and (iii) a load lock 5 for loading or unloading two substrates simultaneously, the load lock chamber 5 being attached to the one additional side of the substrate handling chamber 4, wherein each back end robot 3 is accessible to the load lock chamber 5.

The interior of each chamber 2 and the interior of the load lock chamber 5 may be isolated from the interior of the substrate handling chamber 4 by a gate valve 9. Further, auto wafer centering (AWC) sensors 10a, 10b may be disposed near the gate valve 9 between each chamber 2 and the substrate handling chamber 4 to determine, for example, at least an eccentricity of the substrate relative to a predetermined location of the back end robot 3.

In some embodiments, a controller (not shown) may store software programmed to execute sequences of substrate transfer, for example. The controller may also check the status of each reaction chamber, may position substrates in each reaction chamber using sensing systems including AWC sensors, may control a gas box and electric box for each module, may control a front end robot 7 in an equipment front end module 6 based on a distribution status of substrates stored in FOUP 8 and load lock chamber 5, may control back end robots 3, and may control gate valves 9, as shown in FIG. 1.

A skilled artisan may appreciate that the apparatus includes one or more controller(s) programmed or otherwise configured to cause the deposition and reactor cleaning processes described elsewhere herein to be conducted. The controller(s) may communicate with the various power sources, heating systems, pumps, robotics and gas flow controllers or valves of the reactor, as will be appreciated by the skilled artisan.

In some embodiments, the apparatus may have any number of chamber modules and reaction chambers greater than one (e.g., 2, 3, 4, 5, 6, or 7). In FIG. 1, the apparatus has eight reaction chambers, but it may have ten or more. In some embodiments, the reaction chamber of the modules may be any suitable reactors for processing or treating wafers, including CVD reactors such as plasma-enhanced CVD reactors and thermal CVD reactors, ALD reactors such as plasma-enhanced ALD reactors and thermal ALD reactors, etching reactors, and UV-curing reactors. Typically, the reaction chambers are plasma reactors for depositing a thin film or layer on a wafer. In some embodiments, all the modules may be of the same type having identical capability for treating wafers so that the unloading/loading can sequentially and regularly be timed, thereby increasing productivity or throughput. In some embodiments, the modules may have different capacities (e.g., different treatments), but their handling times are substantially identical.

Figure 2:
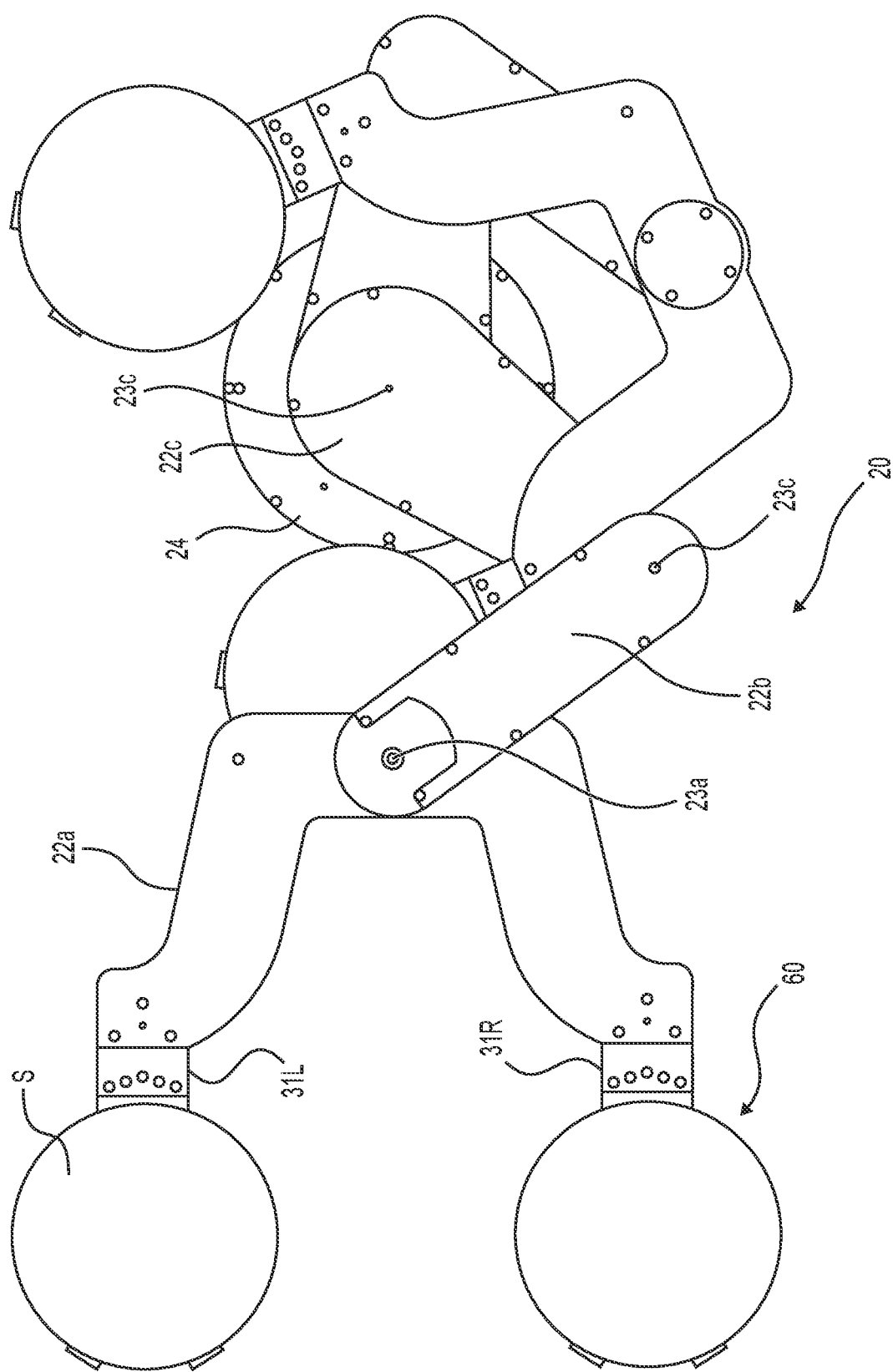
FIG. 2 is a schematic plan view of a dual arm wafer-handling robot usable in an embodiment of the present invention.

FIG. 2 is a schematic plan view of a dual arm substrate handling robot usable in an embodiment of the present invention. The end effector 60 may be configured to be attached to a robotic arm 20. In some embodiments, this type of dual-arm substrate-handling robot may preferably be used in an apparatus illustrated in FIG. 1. However, when the number of reaction chambers is four or less, for example, a single-arm wafer-handling robot can be used. As shown in FIG. 2, the robotic arm 20 may be comprised of a fork-shaped portion 22a, a middle portion 22b, and a bottom portion 22c. The fork-shaped portion 22a may be equipped with end-effectors 60 for supporting substrates thereon. The fork-shaped portion 22a and the middle portion 22b may be connected via a joint 23a, the middle portion 22b and the bottom portion 22c may be connected via a joint 23b, and the bottom portion 22c may be connected to an actuator 24 via a joint 23c.

In some embodiments, any suitable substrate handling robot may be used, such as those disclosed in U.S. Pat. No. 5,855,681, the disclosure of which is herein incorporated by reference in its entirety. In some embodiments, the robotic arm 20 may have a three-prong portion for conveying three wafers at once, instead of a fork-shaped portion. The distal ends of the fork-shaped portion 22a may be provided with joint portions 31L, 31R, to which the joint section 48 of the end effector is attached. This robot arm may be capable of controlling lateral motion of the end effector along an X axis, front and back motion thereof along a Y axis, vertical motion thereof along a Z axis, and rotational motion thereof about the Z axis.

FIG. 3 is a schematic plan view of an end effector according to an embodiment of the present invention. The end effector 60 may comprise a paddle 45 (having a proximal end and a distal end), a ring 50 extending from the paddle 45 (from the distal end of the paddle), a left blade 44b and a right blade 44a extending from the ring 50, and a joint section 48 configured to be attached to a robotic arm 20. Distal ends of the blade 44b, 44a may comprise front protrusions 43b, 43a, respectively, for inhibiting a substrate from dropping from the end effector in the event that the wafer slips. The front protrusions 43a and 43b also may be used for positioning the wafer on the end effector.

A proximal end of the paddle 45 also may have rear protrusions 47a, 47b for restricting displacement of the wafer. The ring 50 may comprise a circular protrusion 52. The circular protrusion 52 may provide more contact points on the substrate than several pins, which are disclosed in U.S. Pat. No. 9,370,863. The substrate-positioning area may be defined by the front protrusions 43b, 43a and the rear protrusions 47a, 47b.

In some embodiments, the end effector 60 may comprise $Al_2O_3$. The substrate-positioning area may have a length of about 300 mm, for example. The diameter of the ring 50 may be 200 mm, which is less than the distance between AWC sensors 10a, 10b. This may allow for the AWC sensors 10a, 10b from mistakenly sensing the ring 50 as a substrate.

As shown in FIG. 3A, the height (H2) of the front protrusions 43a, 43b from the top surface of the end effector 60 may be about 4.5 mm. Also, the height H1 of the circular protrusion 52 from the bottom surface may be about 3.7 mm. The height (H3) of the rear protrusion 47 from the bottom surface may be about 4.8 mm, for example. The above variable numbers can be modified by ±50% in some embodiments while the height (H1) of the circular protrusion 52 may be lower than that of the rear protrusions 47a, 47b (height H3) and that of the front protrusions 43a, 43b (height H2) for inhibiting a substrate from dropping from the end effector 60.

FIG. 4 is a schematic cross-sectional view of an end effector according to an embodiment of the present invention. The edge of the circular protrusion 52 may be rounded. Preferably, the rounded edge may be semi-circular shape. In some embodiments, the semi-circular shape may have a radius of more than 1.0 mm but less than 2.2 mm. The round edge may have a top face having a static friction coefficient of 0.4 or more as measured against the backside of the substrate.

In order to verify whether the end effector 60 shows anti-slip ability, a wafer tilt angle test may be conducted by placing a bare wafer on the end effector. This test may determine a slide angle where the wafer starts to slide. If the slide angle is large, the wafer slip may be suppressed.
Conventional End Effector Disclosed in U.S. Pat. No. 9,370,863.
  Bare wafer tilt angle: Longitudinal direction 7°/Lateral direction 8°
End Effector 60
  Bare wafer tilt angle: Longitudinal direction 17°/Lateral direction 18°

The example embodiments of the disclosure described above do not limit the scope of the invention, since these embodiments are merely examples of the embodiments of the invention. Any equivalent embodiments are intended to be within the scope of this invention. Indeed, various modifications of the disclosure, in addition to those shown and described herein, such as alternative useful combinations of the elements described, may become apparent to those skilled in the art from the description. Such modifications and embodiments are also intended to fall within the scope of the appended claims.

What is claimed is:

1. An end effector for transporting a substrate, comprising:
   a paddle, wherein a proximal end of the paddle is provided with a rear protrusion for positioning a substrate;
   a ring extending from the paddle, wherein the ring is provided with a circular protrusion for supporting the substrate, wherein an outermost perimeter edge of the circular protrusion forms a top surface configured to underlie and support a backside of the substrate when the substrate is mounted of the ring; and
   a blade extending from the ring, wherein a distal end of the blade is provided with a front protrusion for positioning the substrate, wherein a substrate-positioning area of the end effector is defined by the front protrusion and the rear protrusion.

2. The end effector according to claim 1, wherein a height of the circular protrusion is lower than a height of the rear protrusion and the front protrusion.

3. The end effector according to claim 1, wherein the top surface of the circular protrusion is rounded.

4. The end effector according to claim 3, wherein the rounded top surface is semi-circular shape.

5. The end effector according to claim 4, wherein the semi-circular shape has a radius of more than 1.0 mm.

6. The end effector according to claim 3, wherein the rounded top surface has a static friction coefficient of 0.4 or more as measured against the backside of the substrate.

7. The end effector according to claim 1, wherein the end effector comprises $Al_2O_3$.

8. The end effector according to claim 1, wherein the end effector is attached to a robotic arm.

9. The end effector according to claim 8, wherein the robotic arm is configured to move vertically, front and rear, and laterally.

10. A substrate processing apparatus comprising:
    a reaction chamber for processing a substrate;
    a substrate handling chamber attached to the reaction chamber;
    a backend robot disposed in the substrate handling chamber, the backend robot including a robotic arm;
    an end effector attached to the robotic arm, the end effector including:
      a paddle, wherein a proximal end of the paddle is provided with a rear protrusion for positioning the substrate,
      a ring extending from the paddle, wherein the ring is provided with a circular protrusion for supporting the substrate, wherein an outermost perimeter edge of the circular protrusion forms a top surface configured to underlie and support a backside of the substrate when the substrate is mounted on the ring, and
      a blade extending from the ring, wherein a distal end of the blade is provided with a front protrusion for positioning the substrate, wherein a substrate-positioning area of the end effector is defined by the front protrusion and the rear protrusion; and
    a load lock chamber for loading or unloading the substrate, the load lock chamber being attached to the substrate handling chamber.

11. The substrate processing apparatus according to claim 10, further comprising: a plurality of sensors disposed between the reaction chamber and the substrate handling chamber.

12. The substrate processing apparatus according to claim 11, wherein a diameter of the ring is less than a distance between the plurality of sensors.

13. The substrate processing apparatus according to claim 10, wherein a height of the circular protrusion is lower than a height of the rear protrusion and the front protrusion.

14. The substrate processing apparatus according to claim 10, wherein the top surface of the circular protrusion is rounded.

15. The substrate processing apparatus according to claim 14, wherein the rounded top surface is semi-circular shape.

16. The substrate processing apparatus according to claim 15, wherein the semi-circular shape has a radius of more than 1.0 mm.

17. The substrate processing apparatus according to claim 14, wherein the rounded top surface has a static friction coefficient of 0.4 or more as measured against the backside of the substrate.

18. The substrate processing apparatus according to claim 10, wherein the end effector comprises $Al_2O_3$.

19. An end effector for transporting a substrate, comprising:
a paddle having a proximal end and a distal end, wherein the proximal end of the paddle is provided with a first rear protrusion and a second rear protrusion for positioning a substrate;
a ring extending from the distal end of the paddle, wherein the ring is provided with a circular protrusion for supporting the substrate, wherein an outermost perimeter edge of the circular protrusion forms a top surface configured to underlie and support a backside of the substrate when the substrate is mounted on the ring;
a first blade extending from a distal end of the ring, wherein a distal end of the first blade is provided with a first front protrusion for positioning the substrate; and
a second blade extending from the distal end of the ring, wherein a distal end of the second blade is provided with a second front protrusion for positioning the substrate,
wherein a substrate-positioning area of the end effector is defined by the first front protrusion, the second front protrusion, the first rear protrusions, and the second rear protrusion.

20. The end effector according to claim 19, wherein a height of the circular protrusion is lower than heights of the first rear protrusion, the second rear protrusion, the first front protrusion, and the second front protrusion.

\* \* \* \* \*